United States Patent
Farkash et al.

(10) Patent No.: US 7,131,085 B2
(45) Date of Patent: Oct. 31, 2006

(54) DISTRIBUTED BDD REORDERING

(75) Inventors: Monica Farkash, Haifa (IL); Ziv Nevo, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 340 days.

(21) Appl. No.: 10/813,239

(22) Filed: Mar. 30, 2004

(65) Prior Publication Data

US 2005/0229124 A1 Oct. 13, 2005

(51) Int. Cl.
*G06F 17/50* (2006.01)

(52) U.S. Cl. ............................................. 716/5; 716/4
(58) Field of Classification Search ...................... 716/5
See application file for complete search history.

(56) References Cited

U.S. PATENT DOCUMENTS

| | | | | |
|---|---|---|---|---|
| 5,615,127 A | * | 3/1997 | Beatty et al. | 716/7 |
| 5,680,332 A | * | 10/1997 | Raimi et al. | 703/13 |
| 2002/0178423 A1 | | 11/2002 | Ben-David et al. | |
| 2002/0193974 A1 | | 12/2002 | Ben-David et al. | |
| 2003/0004926 A1 | | 1/2003 | Ben-David et al. | |

OTHER PUBLICATIONS

Rudell in "Dynamic Variable Ordering for Ordered Binary Decision Diagrams," Proceedings of the IEEE International Conference on Computer-Aided Design (Santa Clara, California.

Song and Chang "A Variable Reordering Method for Fast Optimization of Binary Decision Diagrams," Proceedings of the Fifth Asian Test Symposium ATS'97 (IEEE, 1997), pp. 228.

Bryant and Meinel "Ordered Binary Decision Diagrams in Electronic Design Automation," published in Logic Synthesis and Verification (Kluwer Academic Publishers, 2001), pages.

Meinel and Slobodova "Speeding Up Variable Reordering of OBDDs," Proceedings of the International Conference on Computer Design (1997), pp. 338-343.

Beer et al., in "RuleBase: an Industry-Oriented Formal Verification Tool," Proceedings of the Design Automation Conference DAC'96 (Las Vegas, Nevada, 1996).

* cited by examiner

*Primary Examiner*—Jack Chiang
*Assistant Examiner*—Brandon Bowers
(74) *Attorney, Agent, or Firm*—Stephen C. Kaufman

(57) ABSTRACT

A method for verification of a system design represented by a model that includes a plurality of variables. The method includes arranging the variables in an Ordered Binary Decision Diagram (OBDD) according to an initial order of the variables, the OBDD including a number of nodes arranged in rows corresponding respectively to the plurality of the variables. Each processor, among a group of two or more computer processors, is assigned a respective variable among the plurality of the variables. Using each processor, the rows of the OBDD are reordered by varying a position in the OBDD of the row corresponding to the respective variable that is assigned to the processor until at least one of the processors identifies a new order for the OBDD. The new order of the OBDD may be used to verify a characteristic of the model against a specification.

18 Claims, 3 Drawing Sheets

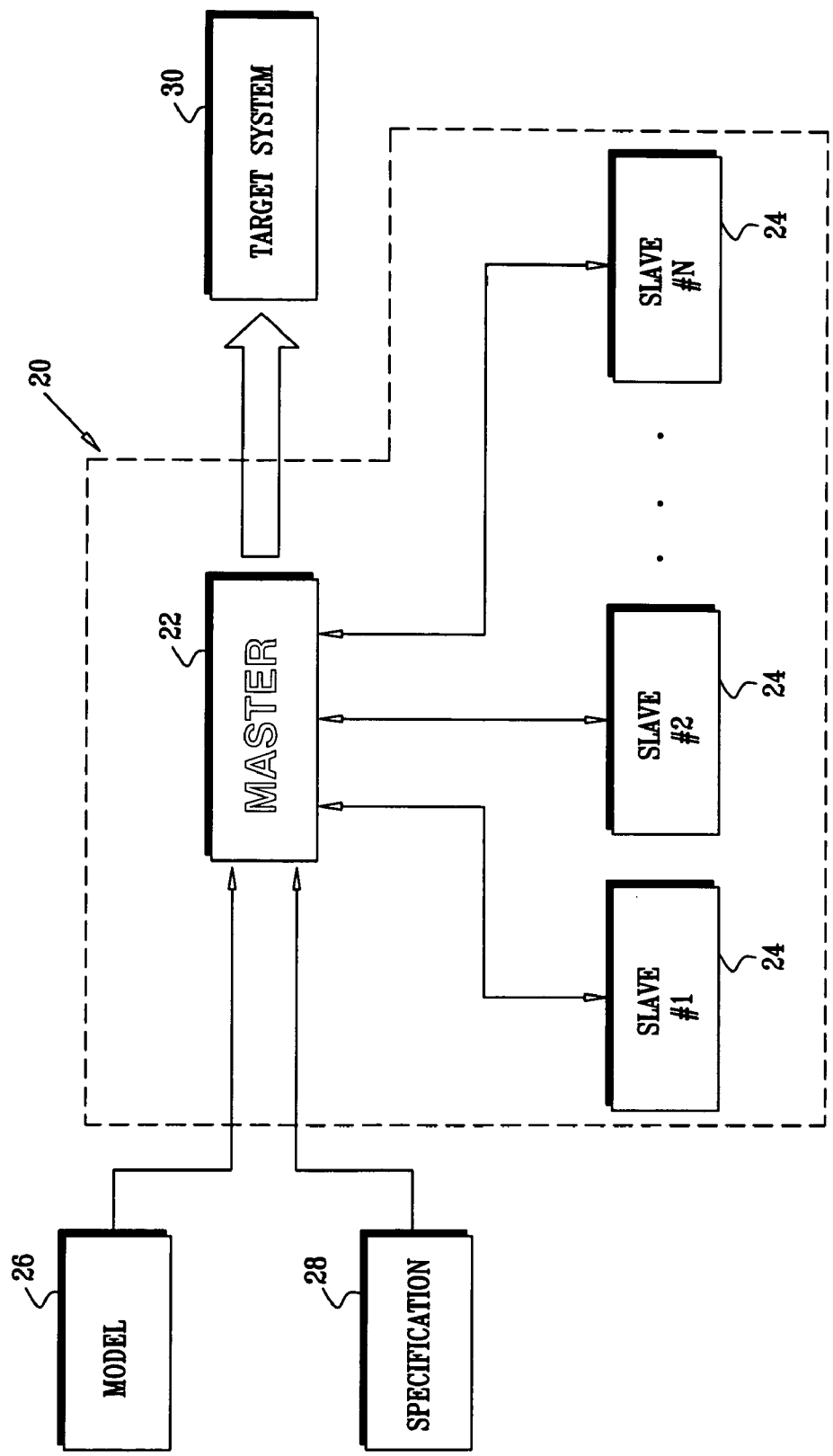

DISTRIBUTED BDD REORDERING

FIELD OF THE INVENTION

The present invention relates generally to design automation and verification, and specifically to design verification techniques that use Binary Decision Diagrams (BDDs) to represent the state of a system under test.

BACKGROUND OF THE INVENTION

Ordered Binary Decision Diagrams (OBDDs) are widely used in design automation, primarily because of the ability of OBDD data structures to represent complex systems in a memory-efficient manner. Tools based on OBDD manipulation have been developed for use, inter alia, in automated formal verification of hardware circuits and other systems that can be represented as finite state machines. For example, U.S. patent application Ser. No. 10/042,304, published as U.S. 2002/0193974 A1, whose disclosure is incorporated herein by reference, describes a method for symbolic model checking based on OBDDs. The method is used to check a model (also referred to as an implementation) of a given hardware design against the design specification. The model is represented by an OBDD, which defines states of the system under study and a transition relation among the states. A reachability analysis is performed, using the OBDD, in order to find traces in the state space of the system that link an initial state to a target state having a specified property, which may either comply with or violate the specification.

Bryant and Meinel provide a useful review of the properties and applications of OBDDs in "Ordered Binary Decision Diagrams in Electronic Design Automation," published in *Logic Synthesis and Verification* (Kluwer Academic Publishers, 2001), pages 285–307, which is incorporated herein by reference. To summarize briefly, an OBDD is a directed acyclic graph consisting of nonterminal nodes labeled by the variables in a set V and terminal nodes labeled by the Boolean constants 1 and 0. Each nonterminal node has two outgoing edges: a 1-edge and a 0-edge. The starting node of the ordered BDD is called the root.

A Boolean function f on the variables in V, for a given assignment of the values of the variables, is computed by following a path from the root to a terminal node. At each node along the path, if the corresponding variable x is assigned the value 1, the path follows the 1-edge. Otherwise, the path follows the 0-edge. Each variable occurs at most once on any given path. The value of the terminal node that is reached at the end of the path is the value of f for the given assignment. All paths from the root to either terminal node respect the variable ordering of the OBDD, i.e., if variable x occurs before variable y on one path in a given BDD ordering, then variable y will never occur before variable x on any other path. Therefore, the OBDD graph is typically "levelized," so that all nodes corresponding to a given variable appear together in a row. The variable ordering of the OBDD can be altered, however, using simple logical techniques that are known in the art, without changing the underlying Boolean function that the OBDD represents.

The size of an OBDD (i.e., the number of nodes in the OBDD, and hence the complexity of its manipulation and memory consumption) depends strongly on the variable order. Therefore, in many OBDD applications, dynamic variable reordering is used to modify the variable order, and thus reduce the size, of the OBDD in the course of the application.

One commonly-used method for OBDD reordering is "sifting," as described by Rudell in "Dynamic Variable Ordering for Ordered Binary Decision Diagrams," *Proceedings of the IEEE International Conference on Computer-Aided Design* (Santa Clara, Calif., 1993), pages 42–47, which is incorporated herein by reference. Sifting makes use of the fact that swapping the order of two adjacent variables in the OBDD affects only the nodes of the OBDD in the corresponding rows of the graph. The sifting algorithm seeks an optimal position for a selected variable in the OBDD by swapping the corresponding row up and down over the entire graph while the positions of all other variables remain fixed. After the variable has traversed all possible positions, the optimal position is identified, and the variable is swapped back to that position. The procedure is then repeated to optimize the positions of other variables.

Other OBDD reordering methods attempt to perform variable reordering over a selected subset or block of the variables. For example Song and Chang describe what they call a "distributed reordering algorithm," in "A Variable Reordering Method for Fast Optimization of Binary Decision Diagrams," *Proceedings of the Fifth Asian Test Symposium ATS'97* (IEEE, 1997), pages 228–233, which is incorporated herein by reference. The algorithm attempts to reduce optimization time by selecting a subset of the variables, which are not adjacent to one another, and exchanging the positions of the variables in the subset. As another example, Meinel and Slobodova describe a block-restricted sifting strategy in "Speeding Up Variable Reordering of OBDDs," *Proceedings of the International Conference on Computer Design* (1997), pages 338–343, which is also incorporated herein by reference. This algorithm uses Rudell's sifting method, but restricts it to certain selected blocks of variables.

SUMMARY OF THE INVENTION

As an OBDD is constructed and evaluated in the course of formal verification, the size of the OBDD tends to grow rapidly, until it consumes all the available memory resources of the computer that is performing the verification process. In response to this problem, verification programs, such as symbolic model checkers, must generally interrupt the verification process in order to reorder the OBDD, and thus reduce its size. The verification program may typically be interrupted in this manner several times before it is able to complete its run. Existing reordering algorithms, such as those described above, are computation-intensive and inefficient. As a result, the computer often spends more time on OBDD reordering than it does on the verification process itself.

Embodiments of the present invention provide methods and systems for accelerating the process of OBDD reordering, by distributing reordering tasks among multiple computer processors. For this purpose, one of the processors is assigned to serve as the master, while one or more of the processors serve as slaves (although the master-processor may serve alternately as both master and slave).

The master assigns each of the slaves a respective variable in the OBDD. Each slave then attempts to reorder the rows of the OBDD by varying the position of the row corresponding to its respective variable. When the slave has identified an optimal reordering, which reduces the size of the OBDD, it reports the new order it has found to the master. The master decides whether to adopt this new order and whether to continue the reordering process. If so, the master distributes the new order to all the slaves along with a new, respective variable assignment. This process continues iteratively until the OBDD has been reduced to a desired size, whereupon the verification process continues using the reordered OBDD.

The slaves may apply substantially any OBDD reordering algorithm known in the art. The inventors have found that it is most efficient to have all the slaves operate simultaneously on the same set of rows of the OBDD—typically covering substantially the entire OBDD—rather than having each of the slaves reorder a separate block or other subset. With all the slaves operating on the same set of rows, the distributed reordering methods described herein can achieve a reduction in reordering time that is greater than linear in the number of slave processors (so that four slave processors, for example, typically complete their reordering tasks in less than 25% of the time required by a single processor to complete the same task). By contrast, the inventors found that block reordering, wherein each slave operates over a separate group of rows, gave inferior results, which are highly dependent on the specific structure of the OBDD.

Part of the reason for the large performance improvement achieved by embodiments of the present invention stems from the fact that in most cases, most of the reduction in OBDD size is due to repositioning just a small number of the variables. Therefore, when the master adopts a new order found by one of the slaves, while discarding the work done concurrently by the other slaves, it generally causes little wasted computational effort on the part of the other slaves. Efficient communication of the new OBDD orders between the master and slaves also saves time and reduces the computational burden that the slaves would otherwise incur by having to swap the variables back to the optimal ordering, as required by the conventional sifting algorithm.

Although the embodiments described herein relate particularly to the use of OBDDs in formal verification, the methods and principles of the present invention may similarly be used in other applications in which OBDDs are used to model a target system.

There is therefore provided, in accordance with an embodiment of the present invention, a method for verification of a system design represented by a model that includes a plurality of variables, the method including:

arranging the variables in an Ordered Binary Decision Diagram (OBDD) according to an initial order of the variables, the OBDD including a number of nodes arranged in rows corresponding respectively to the plurality of the variables;

assigning to each processor, among a group of two or more computer processors, a respective variable among the plurality of the variables;

using each processor, reordering the rows of the OBDD by varying a position in the OBDD of one of the rows, which corresponds to the respective variable that is assigned to the processor, until at least one of the processors identifies a new order for the OBDD; and using the new order of the OBDD, verifying a characteristic of the model against a specification.

Typically, reordering the rows includes, using each processor, finding the new order such that the number of the nodes in the OBDD is reduced relative to the initial order, and reordering the rows includes receiving first and second new orders, respectively, from first and second processors among the two or more computer processors, and selecting the new order from among the first and second new orders so as to minimize the number of the nodes in the OBDD.

Typically, reordering the rows includes operating simultaneously with at least two of the processors on a common set of the rows. In disclosed embodiments, operating simultaneously includes operating on substantially all the rows of the OBDD using all of the at least two of the processors. Reordering the rows may include sifting the rows of the OBDD.

In disclosed embodiments, the method includes replacing the initial order with the new order, and repeating the steps of assigning the respective variable and reordering the rows based on the new order until a predefined reordering criterion is satisfied. Typically, the reordering criterion determines a maximum number of the nodes in the BDD. When the two or more computer processors include first and second processors, reordering the rows typically includes receiving the new order from the first processor, and replacing the initial order includes communicating the new order to the second processor for use in repeating the step of reordering the rows. In some embodiments, reordering the rows includes receiving first and second new orders, respectively, from the first and second processors, and selecting the first new order according to a predefined selection criterion.

In a disclosed embodiment, verifying the characteristic includes operating on the OBDD using the group of computer processors while saving data regarding the OBDD in a memory until a predetermined amount of space in the memory has been consumed, and repeating the steps of assigning the respective variable and reordering the rows includes repeating the steps after operating on the OBDD to verify the characteristic so as to reduce the amount of space occupied by the OBDD in the memory. Typically, verifying the characteristic includes applying a symbolic model checker to verify the model against the specification.

There is also provided, in accordance with an embodiment of the present invention, apparatus for verification of a system design represented by a model that includes a plurality of variables, the apparatus including a master processor and one or more slave processors, wherein the master processor is arranged to receive an Ordered Binary Decision Diagram (OBDD) representing the model according to an initial order of the variables, the OBDD including a number of nodes arranged in rows corresponding respectively to the plurality of the variables, and to assign to each of the one or more slave processors a respective variable among -the plurality of the variables, and wherein each slave processor is arranged to reorder the rows of the OBDD by varying a position in the OBDD of one of the rows, which corresponds to the respective variable that is assigned to the slave processor, until at least one of the slave processors identifies a new order for the OBDD, and wherein at least one of the master and slave processors is further arranged to verify a characteristic of the model against a specification using the new order of the OBDD.

In some embodiments, the master processor is further arranged to function as one of the slave processors.

There is additionally provided, in accordance with an embodiment of the present invention, a computer software product for verification of a system design represented by a model that includes a plurality of variables, the product including a computer-readable medium in which program instructions are stored, which instructions, when read by a group of two or more computer processors in mutual communication, cause one of the computer processors to serve as a master processor, and cause bone or more of the computer processors to serve as slave processors, wherein the instructions cause the master processor to receive an Ordered Binary Decision Diagram (OBDD) representing the model according to an initial order of the variables, the OBDD including a number of nodes arranged in rows corresponding respectively to the plurality of the variables, and to assign to each of the one or more slave processors a respective variable among the plurality of the variables, and wherein the instructions cause each slave processor to reorder the rows of the OBDD by varying a position in the OBDD of one of the rows, which corresponds to the respective variable that is assigned to the slave processor, until at least one of the slave processors identifies a new order for the OBDD, and wherein the instructions further cause at least one of the computer processors to verify a characteristic of the model against a specification using the new order of the OBDD.

There is further provided, in accordance with an embodiment of the present invention, a method for modeling a target system, the method including:

identifying a plurality of variables that characterize the target system and a Boolean function that is applicable to the variables;

responsively to the Boolean function, arranging the variables in an Ordered Binary Decision Diagram (OBDD) according to an initial order of the variables, the OBDD including a number of nodes arranged in rows corresponding respectively to the plurality of the variables;

assigning to each processor, among a group of two or more computer processors, a respective variable among the plurality of the variables; and using each processor, reordering the rows of the OBDD by varying a position in the OBDD of one of the rows, which corresponds to the respective variable that is assigned to the processor, until at least one of the processors identifies a new order for the OBDD.

There is moreover provided, in accordance with an embodiment of the present invention, apparatus for modeling a target system, including a master processor and one or more slave processors, wherein the master processor is arranged to receive a model of the target system characterized by a plurality of variables and a Boolean function, wherein the model is represented by an Ordered Binary Decision Diagram (OBDD) according to an initial order of the variables, the OBDD including a number of nodes arranged in rows corresponding respectively to the plurality of the variables, and wherein the master processor is arranged to assign to each of the one or more slave processors a respective variable among the plurality of the variables, and wherein each slave processor is arranged to reorder the rows of the OBDD by varying a position in the OBDD of one of the rows, which corresponds to the respective variable that is assigned to the slave processor, until at least one of the slave processors identifies a new order for the OBDD.

There is furthermore provided, in accordance with an embodiment of the present invention, a computer software product for modeling a target system, the product including a computer-readable medium in which program instructions are stored, which instructions, when read by a group of two or more computer processors in mutual communication, cause one of the computer processors to serve as a master processor, and cause one or more of the computer processors to serve as slave processors, wherein the instructions cause the master processor to receive a model of the target system characterized by a plurality of variables and a Boolean function, wherein the model is represented by an Ordered Binary Decision Diagram (OBDD) according to an initial order of the variables, the OBDD including a number of nodes arranged in rows corresponding respectively to the plurality of the variables, and wherein the instructions further cause the master processor to assign to each of the one or more slave processors a respective variable among the plurality of the variables, and wherein the instructions cause each slave processor to reorder the rows of the OBDD by varying a position in the OBDD of one of the rows, which corresponds to the respective variable that is assigned to the slave processor, until at least one of the slave processors identifies a new order for the OBDD, and wherein the instructions further cause at least one of the computer processors to verify a characteristic of the model against a specification using the new order of the OBDD.

The present invention will be more fully understood from the following detailed description of the embodiments thereof, taken together with the drawings in which:

BRIEF DESCRIPTION OF THE DRAWINGS

FIG. 1 is a block diagram that schematically illustrates a system for formal verification, in accordance with an embodiment of the present invention;

DETAILED DESCRIPTION OF EMBODIMENTS

Figure 2B:
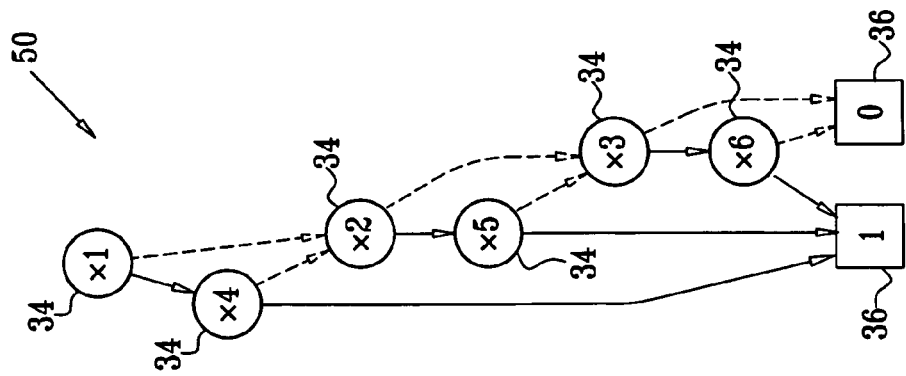
FIGS. 2A and 2B are graphs that schematically illustrate an OBDD before and after variable reordering.

FIG. 1 is a block diagram that schematically illustrates a computer system 20 for formal verification, in accordance with an embodiment of the present invention. System 20 comprises a master processor 22 and one or more slave processors 24, referred to hereinbelow as master 22 and slaves 24. Each of master 22 and slaves 24 comprises a central processing unit (CPU) and memory (not shown), along with suitable communication interfaces, as are known in the art. Master 22 may also serve as one of the slaves for purposes of OBDD reordering. System 20 may comprise a multi-processor computer, containing the master and slave processors, each with its own memory resources or memory partition. Alternatively, system 20 may comprise a cluster of separate computers, which serve as the master and slaves. Other multi-processor system configurations will be apparent to those skilled in the art, and are considered to be within the scope of the present invention.

System 20 typically carries out the functions described herein under the control of suitable software, such as a model checking software package, into which the OBDD reordering functions described below are integrated. For example, system 20 may run RuleBase Parallel Edition, which is sold by IBM Corporation (Armonk, N.Y.). RuleBase is described generally by Beer et al., in "RuleBase: an Industry-Oriented Formal Verification Tool," *Proceedings of the Design Automation Conference DAC'96* (Las Vegas, Nev., 1996), which is incorporated herein by reference. The software may be downloaded to system 20 in electronic form, over a network, for example, or it may be supplied on tangible media, such as DVD, CD-ROM or non-volatile memory.

System 20 receives a hardware implementation model 26 of a target system 30 in development, such as an integrated circuit design. The model may refer to the entire target system or device or to a sub-unit, such as a circuit or functional block. System 20 synthesizes an OBDD representing the model, using methods of OBDD synthesis that are known in the art (as described, for example, in the above-mentioned article by Bryant and Meinel). A user of system 20 prepares and inputs a specification 28, comprising properties for use in model checking of model 26, and selects other initial parameters. System 20 then analyzes the model, using the OBDD representation, to find full or partial traces through the state space of the model, in order to verify that the model satisfies specification 28. At various stages in the operation of system 20, the model checking process is interrupted in order to reorder the OBDD, using the methods described hereinbelow. Details of specific methods of model checking that may be applied by system 20 are described, for example, in the above-mentioned U.S. patent application Ser. No. 10/042,304, as well as in U.S. patent application Ser. No. 10/042,293 (published as U.S. 2002/0178423 A1) and Ser. No. 10/042,294 (published as U.S. 2003/0004926 A1), whose disclosures are incorporated herein by reference.

Figure 2A:
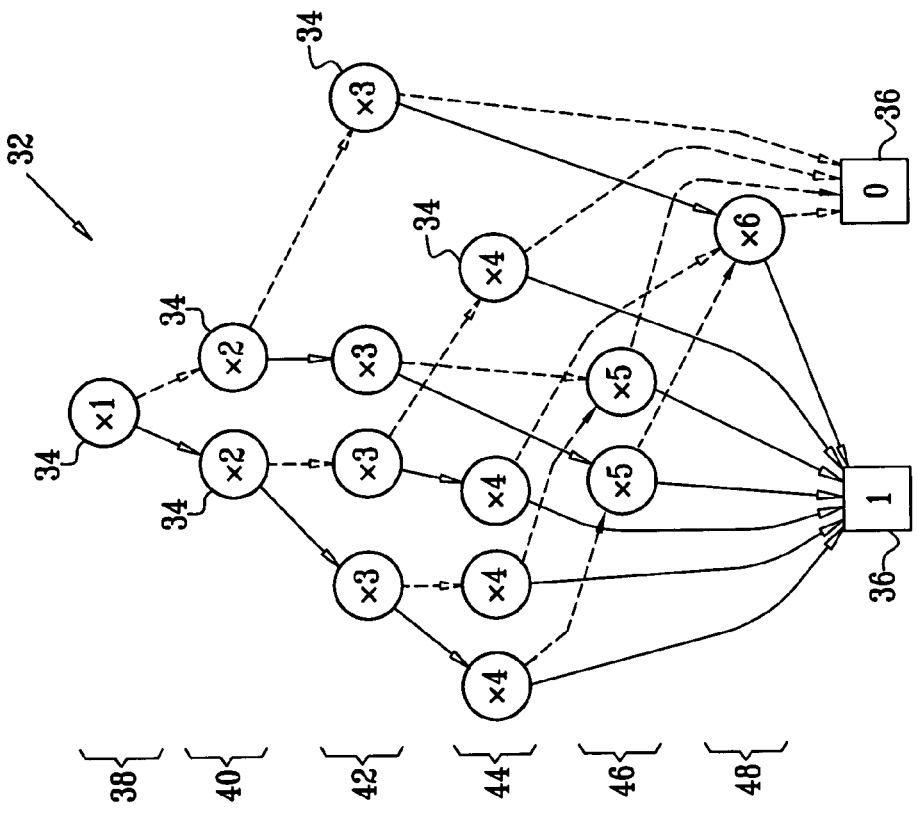

FIG. 2A is a graph 32 that schematically illustrates an exemplary OBDD, illustrating the impact of variable reordering on OBDD size. Graph 32 represents the Boolean function $f(x_1, \ldots, x_6) = (x_1 \hat{\ } x_4) \vee (x_2 \hat{\ } x_5) \vee (x_3 \hat{\ } x_6)$. Nonterminal nodes 34 correspond to variables $x_1, \ldots, x_6$, wherein $x_1$ is at the root node. Terminal nodes 36 correspond to 1- and 0-values of the function. The 1-edge originating from each node 34 is shown as a solid arrow, while the 0-edge is shown as a dashed arrow. The graph may be constructed, for example, by Shannon decomposition of f, followed by elimination and merging of redundant nodes, as described in the above-mentioned article by Bryant and Meinel. The decomposition in this case was performed according to the nominal order of the variables, i.e., $x_1, x_2, x_3, \ldots$. The graph is levelized, so that nodes 34 corresponding to each of the variables are arranged in a respective row 38, 40, 42, 44, 46, 48.

FIG. 2B is a graph 50 of the OBDD of FIG. 2A following reordering of nodes 34. The reordering may be accomplished by sifting, as described in the above-mentioned article by Rudell, leading (in this case) to swapping the position of row 42 with row 44 and then with row 46, and then swapping the position of row 44 with row 40. More generally, the variables are swapped over substantially all of the rows in graph 32, i.e., over all the rows except the row containing terminal nodes 36. After each swap, redundant nodes are removed by elimination and merging, as described above. As a result, graph 50 represents the same Boolean function f as graph 32, but with only one node per row. Although this example illustrates the power of OBDD reordering, such extreme reduction in the size of the OBDD is not achieved in most practical cases.

Figure 3:
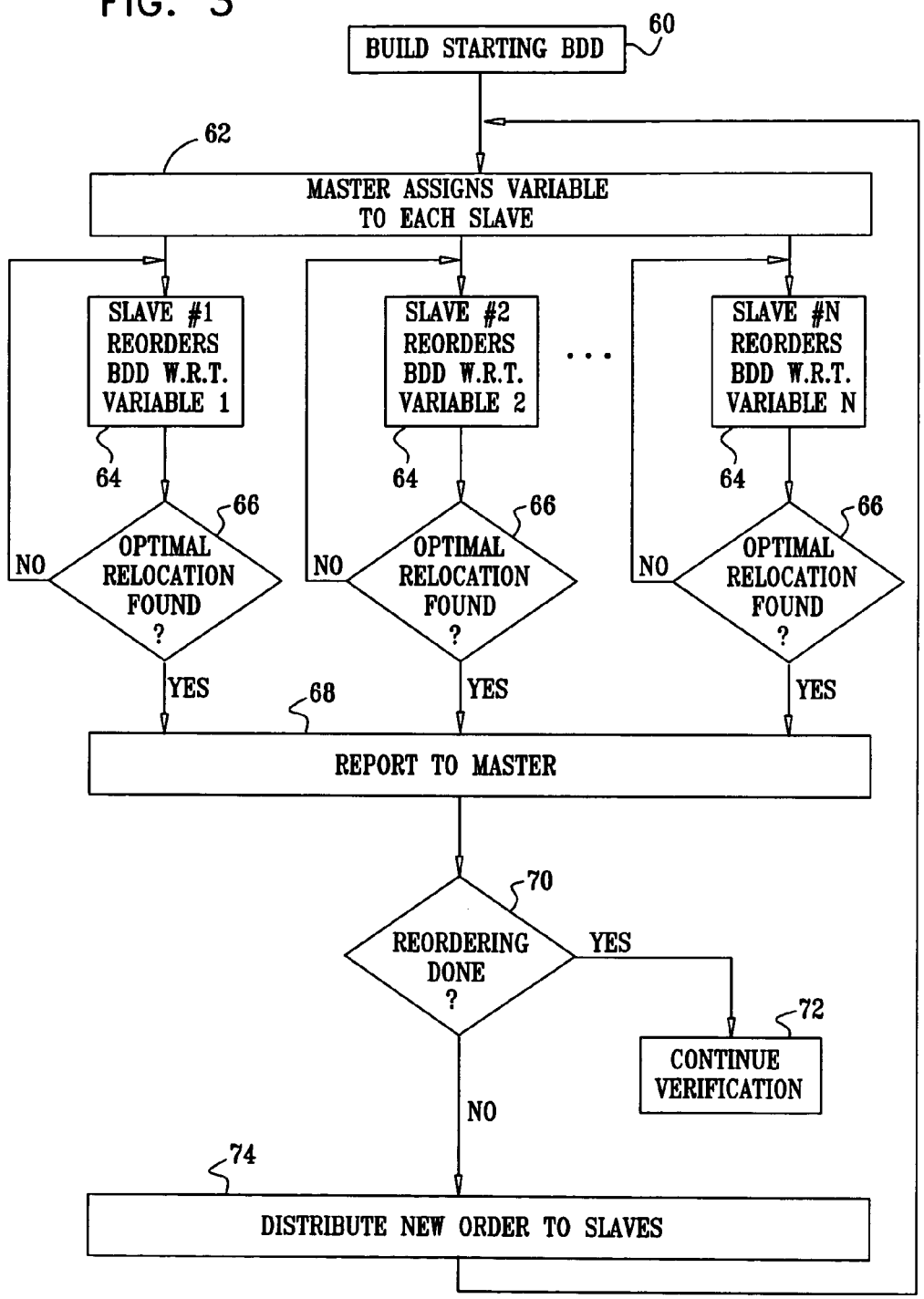
FIG. 3 is a flow chart that schematically illustrates a method for OBDD reordering, in accordance with an embodiment of the present invention.

FIG. 3 is a flow chart that schematically illustrates a method for OBDD reordering, in accordance with an embodiment of the present invention. Operation of the method is described hereinbelow with reference to system 20 (FIG. 1), but the method may similarly be applied in other contexts in which OBDD size reduction is desired. The method starts with construction of a starting OBDD, with a given variable ordering, at an initiation step 60. In the present example, the starting OBDD may be synthesized by the model checking software running on system 20, based on the transition relation of the model 26. The "starting OBDD" provided at step 60 may, by the same token, be in a form computed by the model checking software as the model checking process proceeds. As noted above, the model checking process may be interrupted a number of times in order to carry out the method shown in FIG. 3.

To begin the reordering process, master 22 passes the OBDD to each of slaves 24, and assigns a respective variables to each slave, at an assignment step 62. Typically, the master starts by choosing the variables having the largest number of nodes in their respective rows of the OBDD, and assigning one of these variables to each of the slaves. Alternatively, the same variable may be assigned to two of the slaves, wherein one of the slaves is instructed to swap the variable successively upward, toward the root node, while the other slave is instructed to swap the variable successively downward, toward the terminal nodes. Other criteria and schemes for variable assignment will be apparent to those skilled in the art.

Each slave 24 reorders the rows in the OBDD with respect to its assigned variable, at a reordering step 64. (Meanwhile, master 22 saves the OBDD with the existing row ordering in its memory.) Typically, slaves 24 use Rudell's sifting method, as described above, wherein the position of the assigned variable is first swapped down to the bottom of the OBDD (just above the terminal row), and is then swapped back up to the top. Alternatively, the slaves may be constrained to swap the variable position within certain row boundaries. The boundaries for this purpose may be determined based on the structure of the OBDD, as described, for example, in the above-mentioned article by Meinel and Slobodova. Alternatively, the boundaries may be set according to heuristic criteria, for example, defining a range equal to a certain fraction of the number of rows in the OBDD. When row swapping within particular boundaries does not give the desired reduction in OBDD size, the boundaries may be enlarged. Further alternatively, slaves 24 may apply other reordering algorithms that are known in the art, such as the window permutation algorithm, which is also described in the above-mentioned article by Rudell.

After each swap, slave 24 removes redundant nodes and counts the change in the number of nodes in the OBDD. The slave tracks the changes in order to determine the optimal position for its assigned variable, in which the OBDD has the smallest number of nodes, at an optimization step 66. Typically, the slave is able to ascertain the optimal position after it has swapped the variable position over all the rows of the assigned swapping range. As noted above, this range may include substantially all the rows of the OBDD, or it may alternatively include the rows only in a limited range. Alternatively, the slaves may apply an optimization criterion that permits them to identify a variable position as "optimal" without traversing the entire range. As long as the slave has not yet found the optimal variable position, and has not received any contrary instruction from master 22, the slave continues reordering the OBDD at step 64.

Upon finding the optimal position for its assigned variable, slave 24 reports the result to master 22, at a reporting step 68. The report typically includes the "reordering gain," i.e., the reduction in the number of nodes in the OBDD, as well as the changes that have been made in the OBDD structure as a result of the reordering. Master 22 then decides whether to adopt the reordering proposed by one of slaves 24, at a reordering decision step 70. Master 22 may make the decision either synchronously or asynchronously relative to the operation of slaves 24. In the synchronous mode, master 22 waits to receive reports from all of slaves 24 at step 68, before choosing the best reordering (typically the reordering that gives the greatest reordering gain). Alternatively, in the asynchronous mode, slaves 24 operate continuously, and master 22 may decide to adopt a new ordering reported by one of the slaves at step 68, while the other slaves are still working on their respective reordering tasks at step 64. In this case, the master may decide to adopt the new ordering when it provides a reordering gain in excess of a predetermined threshold or satisfies some other criterion. In any case, upon deciding to adopt a given reordering, the master reorders the OBDD held in its own local memory to accord with the new order.

Also at step 70, master 22 evaluates the reordered OBDD that it has received from slave 24 in order to determine whether to terminate the reordering process. Typically, the process terminates when the size of the OBDD has been reduced below a certain level, or alternatively, after completing a certain number of iterations through the method of FIG. 3 or after a certain amount of time has been spent on reordering. Upon termination of the reordering process, the reordered OBDD last adopted by the master is used in continuing the verification process, at a verification step 72.

On the other hand, if master 22 decides at step 70 to continue the reordering process, it passes the reordered OBDD that it has adopted to all the slaves, at a distribution step 74. If the master is operating asynchronously, as described above, it instructs all the slaves that have not yet completed their reordering tasks at step 64 to terminate these tasks immediately. Asynchronous operation is thus advantageous in that once one of the slaves has found a beneficial reordering, the new order is passed to the remaining slaves immediately. Thus, the slaves waste little time on alternative reorderings that will not be used by system 20, and also may avoid the final step in Rudell's method of swapping the sifted row back to the optimal position that they have found.

In order to reduce the burden of communication between master 22 and slaves 24, the OBDD structure is typically communicated in a compact, "flat" format: At step 74, for example, master 22 first transmits the number of rows in the OBDD, followed by the number of nodes in each row, then followed by a sequence of couples of numbers defining the nodes in raster order, starting from the bottom row of the OBDD. For each node in the sequence, the corresponding couple has the form {left child node, right child node}, wherein the left and right child nodes are the nodes to which the 1- and 0-edges leaving the node connect. The child nodes are identified in the couple by sequential numbers indicating the respective positions of the left and right child nodes in the raster order.

After master 22 has distributed the new OBDD order to slaves 24 at step 74, it returns to step 62 and assigns a new variable for each of the slaves to reorder. System 20 thus continues to iterate through the process of FIG. 3 until the termination criterion is satisfied at step 70.

Although the embodiments described above relate specifically to the use of OBDDs in symbolic model checking, the methods of variable reordering taught by the present invention may similarly be applied in other areas in which BDDs are used. Some of these areas are enumerated in the above-mentioned article by Bryant and Meinel. For example, OBDDs may be used in automated synthesis of gate-level implementations of logic circuits, as well as in verifying that a given implementation is logically equivalent to and consistent with the logical specification of the circuit. As another example, OBDDs may be used in formal verification of sequential systems, such as controllers or protocols, including both hardware- and software-based systems. This sort of formal verification is typically performed by modeling the system as a finite state machine (FSM) with a transition relation among the system variables that defines transitions among the states of the FSM, expressed in terms of an OBDD. The principles of the present invention are useful in alleviating OBDD size explosion in all these applications.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for verification of a system design represented by a model that includes a plurality of variables, the method comprising:
    arranging the variables in an Ordered Binary Decision Diagram (OBDD) according to an initial order of the variables, the OBDD comprising a number of nodes arranged in rows corresponding respectively to the plurality of the variables;
    assigning to each processor, among a group of two or more computer processors, a respective variable among the plurality of the variables;
    using each processor, reordering the rows of the OBDD by varying a position in the OBDD of one of the rows, which corresponds to the respective variable that is assigned to the processor, until at least one of the processors identifies a new order for the OBDD: and
    using the new order of the OBDD, verifying a characteristic of the model against a specification,
    wherein reordering the rows comprises,
        using each processor, finding the new order such that the number of the nodes in the OBDD is reduced relative to the initial order; and
        receiving first and second new orders, respectively, from first and second processors among the two or more computer processors, and selecting the new order from among the first and second new orders so as to minimize the number of the nodes in the OBDD.

2. The method according to claim 1, wherein reordering the rows comprises operating simultaneously with at least two of the processors on a common set of the rows.

3. The method according to claim 2, wherein operating simultaneously comprises operating on substantially all the rows of the OBDD using all of the at least two of the processors.

4. The method according to claim 1, and comprising replacing the initial order with the new order, and repeating the steps of assigning the respective variable and reordering the rows based on the new order until a predefined reordering criterion is satisfied,
    wherein the two or more computer processors comprise first and second processors, and wherein reordering the rows comprises receiving the new order from the first processor, and wherein replacing the initial order comprises communicating the new order to the second processor for use in repeating the step of reordering the rows.

5. The method according to claim 4, wherein reordering the rows comprises receiving first and second new orders, respectively, from the first and second processors, and selecting the first new order according to a predefined selection criterion.

6. The method according to claim 1, and comprising replacing the initial order with the new order, and repeating the steps of assigning the respective variable and reordering the rows based on the new order until a predefined reordering criterion is satisfied, wherein verifying the characteristic comprises operating on the OBDD using the group of computer processors while saving data regarding the OBDD in a memory until a predetermined amount of space in the memory has been consumed, and wherein repeating the steps of assigning the respective variable and reordering the rows comprises repeating the steps after operating on the OBDD to verify the characteristic so as to reduce the amount of space occupied by the OBDD in the memory.

7. A computer software product for verification of a system design represented by a model that includes a plurality of variables, the product comprising a computer-readable medium in which program instructions are stored, which instructions, when read by a group of two or more computer processors in mutual communication, cause one of the computer processors to serve as a master processor, and cause one or more of the computer processors to serve as slave processors, wherein the instructions cause the master processor to receive an Ordered Binary Decision Diagram (OBDD) representing the model according to an initial order of the variables, the OBDD comprising a number of nodes arranged in rows corresponding respectively to the plurality of the variables, and to assign to each of the one or more slave processors a respective variable among the plurality of the variables, and wherein the instructions cause each slave processor to reorder the rows of the OBDD by varying a position in the OBDD of one of the rows, which corresponds to the respective variable that is assigned to the slave processor, until at least one of the slave processors identifies a new order for the OBDD, and wherein the instructions further cause at least one of the computer processors to verify a characteristic of the model against a specification using the new order of the OBDD, and wherein the instructions cause each of the slave processors to find the new order such that the number of the nodes in the OBDD is reduced relative to the initial order, and wherein the instructions cause at least two of the computer processors to serve respectively as first and second slave processors, and wherein the instructions cause the master processor to receive first and second new orders, respectively, from the first and second slave processors and to select the new order from among the first and second new orders so as to minimize the number of the nodes in the OBDD.

8. The product according to claim 7, wherein the instructions cause at least two of the computer processors to serve as slave processors, and further cause the at least two of the processors to reorder the rows by operating simultaneously on a common set of the rows.

9. The product according to claim 8, wherein the instructions cause the at least two of the processors to operate simultaneously on substantially all the rows of the OBDD.

10. The product according to claim 7, wherein the instructions cause the master processor to replace the initial order with the new order, and to repeat assigning a new respective variable to each of the slave processors, so as to cause the slave processors to repeat reordering the rows based on the new order until a predefined reordering criterion is satisfied, and wherein the instructions cause at least two of the computer processors to serve respectively as first and second slave processors, and wherein the instructions cause the master processor to receive the new order from the first processor, and to communicate the new order to the second processor for use in repeating the reordering of the rows.

11. The product according to claim 10, wherein the instructions cause the master processor to receive first and second new orders, respectively, from the first and second slave processors, and to select the first new order according to a predefined selection criterion.

12. The product according to claim 7, wherein the instructions cause the at least one of the computer processors to verify the characteristic of the model by operating on the OBDD while saving data regarding the OBDD in a memory until a predetermined amount of space in the memory has been consumed, and wherein the instructions further cause the master processor to assign the new respective variable to each of the slave processors and to cause the slave processors to repeat the reordering of the rows so as to reduce the amount of space occupied by the OBDD in the memory due to operating on the OBDD to verify the characteristic.

13. A method for modeling a target system, the method comprising:

identifying a plurality of variables that characterize the target system and a Boolean function that is applicable to the variables;

responsively to the Boolean function, arranging the variables in an Ordered Binary Decision Diagram (OBDD) according to an initial order of the variables, the OBDD comprising a number of nodes arranged in rows corresponding respectively to the plurality of the variables;

assigning to each processor, among a group of two or more computer processors, a respective variable among the plurality of the variables; and using each processor, reordering the rows of the OBDD by varying a position in the OBDD of one of the rows, which corresponds to the respective variable that is assigned to the processor, until at least one of the processors identifies a new order for the OBDD, wherein reordering the rows comprises operating simultaneously with at least two of the processors on a common set of the rows.

14. The method according to claim 13, wherein operating simultaneously comprises operating on substantially all the rows of the OBDD using all of the at least two of the processors.

15. The method according to claim 13, and comprising replacing the initial order with the new order, and repeating the steps of assigning the respective variable and reordering the rows based on the new order until a predefined reordering criterion is satisfied, wherein the two or more computer processors comprise first and second processors, and wherein reordering the rows comprises receiving the new order from the first processor, and wherein replacing the initial order comprises communicating the new order to the second processor for use in repeating the step of reordering the rows.

16. A computer software product for modeling a target system, the product comprising a computer-readable medium in which program instructions are stored, which instructions, when read by a group of two or more computer processors in mutual communication, cause one of the computer processors to serve as a master processor, and cause one or more of the computer processors to serve as slave processors, wherein the instructions cause the master processor to receive a model of the target system characterized by a plurality of variables and a Boolean function, wherein the model is represented by an Ordered Binary Decision Diagram (OBDD) according to an initial order of the variables, the OBDD comprising a number of nodes arranged in rows corresponding respectively to the plurality of the variables, and wherein the instructions further cause the master processor to assign to each of the one or more slave processors a respective variable among the plurality of the variables, and wherein the instructions cause each slave processor to reorder the rows of the OBDD by varying a position in the OBDD of one of the rows, which corresponds to the respective variable that is assigned to the slave processor, until at least one of the slave processors identifies a new order for the OBDD, and wherein the instructions further cause at least one of the computer processors to verify a characteristic of the model against a specification using the new order of the OBDD, and wherein the instructions cause at least two of the computer processors to serve as slave processors, and further cause the at least two of the processors to reorder the rows by operating simultaneously on a common set of the rows.

17. The product according to claim 16, wherein the instructions cause the at least two of the processors to operate simultaneously on substantially all the rows of the OBDD.

18. The product according to claim 16, wherein the instructions cause the master processor to replace the initial order with the new order, and to repeat assigning a new respective variable to each of the slave processors, so as to cause the slave processors to repeat reordering the rows based on the new order until a predefined reordering criterion is satisfied, and wherein the instructions cause at least two of the computer processors to serve respectively as first and second slave processors, and wherein the instructions cause the master processor to receive the new order from the first processor, and to communicate the new order to the second processor for use in repeating the reordering of the rows.

* * * * *